United States Patent [19]

Kaneko et al.

[11] Patent Number: 5,747,375
[45] Date of Patent: May 5, 1998

[54] METHOD OF MANUFACTURING A SEMICONDUCTOR INTEGRATED CIRCUIT DEVICE

[75] Inventors: Satoru Kaneko, Kumagaya; Toshiyuki Ohkoda, Ohra-gun, both of Japan

[73] Assignee: Sanyo Electric Co., Ltd., Osaka, Japan

[21] Appl. No.: 673,052

[22] Filed: Jul. 1, 1996

Related U.S. Application Data

[63] Continuation-in-part of Ser. No. 509,749, Aug. 13, 1995, Pat. No. 5,565,699, which is a continuation of Ser. No. 278,135, Jul. 21, 1994, abandoned.

[30] Foreign Application Priority Data

Jul. 22, 1993 [JP] Japan ................... 5-181564

[51] Int. Cl.$^6$ .................................................. H01L 21/20
[52] U.S. Cl. ...................... 438/396; 438/759; 438/760; 438/778; 438/791
[58] Field of Search ............... 437/228, 228 SE, 437/228 PC, 241, 238; 438/381, 393, 759, 760, 778, 791, 396

[56] References Cited

U.S. PATENT DOCUMENTS

| | | |
|---|---|---|
| 4,638,400 | 1/1987 | Brown et al. . |
| 4,978,419 | 12/1990 | Nanda et al. ............... 156/643 |
| 5,083,184 | 1/1992 | Eguchi ........................ 357/51 |
| 5,554,940 | 9/1996 | Hubacher .................... 324/765 |

FOREIGN PATENT DOCUMENTS 466 016  1/1992  European Pat. Off. .

OTHER PUBLICATIONS

Brown et al., "Advanced Analog CMOS Technology" International Electron Devices Meeting Technical Digest, pp. 260–263, 1985.

Primary Examiner—Charles L. Bowers, Jr.
Assistant Examiner—Toniae M. Thomas
Attorney, Agent, or Firm—Wenderoth, Lind & Ponack

[57] ABSTRACT

A method of manufacturing a semiconductor integrated circuit device employs a new reflowing process of an insulating film having contact holes and openings therethrough. A good step coverage of a wiring electrode at the contact holes of the insulating film can be obtained with reduced thermal cycles in the manufacturing of integrated circuit devices, and also with a reduced heat treatment temperature of the reflowing process. The process includes a step of depositing a silicon nitride film on the insulating film and on the contact holes by chemical vapor deposition at a temperature between 700° C. and 800° C. so as to deform edges of the contact holes in the insulating film to be rounded and smooth.

4 Claims, 8 Drawing Sheets

METHOD OF MANUFACTURING A SEMICONDUCTOR INTEGRATED CIRCUIT DEVICE

CROSS-REFERENCE TO RELATED APPLICATIONS

This is a continuation-in-part of application Ser. No. 08/509,749, filed Aug. 13, 1995, now U.S. Pat. No. 5,565,699 which in turn is a continuation of application Ser. No. 08/278,135, filed Jul. 21, 1994 and now abandoned.

BACKGROUND OF THE INVENTION

1. Field of the Invention

The present invention relates to a method of manufacturing a semiconductor integrated circuit device, and more particularly to a reflowing process of an insulating film so as to deform edges of openings and contact holes opened therein to be smooth and round. Also, the present invention relates to a method of manufacturing a semiconductor integrated circuit device which has at least a capacitance element comprising a high dielectric thin film sandwiched with electrode materials and can prevent cracking in the high dielectric thin film.

2. Description of the Related Art

Junction-type capacitors, MOS-type capacitors, MIS-type capacitors, and the like are capacitance elements which may be integrated into a semiconductor integrated circuit device. The junction-type capacitor uses a PN-junction capacitance. The MOS-type capacitor uses a silicon oxide film sandwiched between a diffusion region (or lower electrode) and an upper metal electrode. The MIS-type capacitor uses a silicon nitride film having a higher dielectric constant instead of the silicon oxide film.

Without using the diffusion region, both the upper and lower electrodes can be made of wiring electrode material for sandwiching the dielectric thin film therebetween. This structure can avoid a voltage dependency of a capacitance value because it has no variation of voltage drop by resistance of diffusion region.

FIGS. 7A and 7B show a conventional structure of the capacitance element. FIG. 7A is a plan view showing a structure of the capacitance element described above. FIG. 7B is a cross-sectional view taken along line F—F in FIG. 7A. Referring to FIGS. 7A and 7B, a lower electrode 2 of a polycrystalline silicon film is formed on a LOCOS (local oxidation) oxide film 1 formed on a semiconductor substrate. A silicon nitride film 5 is deposited so as to cover an opening 4 in an interlayer insulating film 3. An upper electrode 6 is formed on the silicon nitride film 5 using a part of an aluminum wiring electrode. An aluminum take-out electrode 8 is electrically in contact with the lower electrode 2 via a contact hole 7 in the interlayer insulating film 3. The capacitance element having the above mentioned structure is disclosed, for example, in Japanese laid-open Patent Publication 2-226755.

Also as illustrated in FIG. 7B, it has been apparent that a boron-phosphosilicate glass (BPSG) film used as the interlayer insulating film 3 causes a crack 9 in the silicon nitride film positioned at the bottom of the opening 4, and thus frequently causes electrical short circuits between the upper electrode 6 and the lower electrode 2.

The inventors of the present invention have made a study on the causes of such short circuits, and it has been discovered that the cracking 9 occurs when the silicon nitride film 5 is deposited, but does not occur by heat treatments after the deposition of the silicon nitride film 5.

Normally, the deposition temperature of the silicon nitride film 5 in a LPCVD process ranges from 700° C. to 800° C. The reflow temperature of the BPSG film is about 900° C. Hence, it is considered that the BPSG film is not deformed in shape at the deposition temperature of the silicon nitride film 5.

However, it is considered that since a thermal expansion coefficient of the BPSG film is substantially different from the silicon nitride film 5, the BPSG film is excessively deformed during the deposition of the silicon nitride film by an effect of stress in the direction of the arrow 10 (shown in FIG. 7B) which is applied from the silicon nitride film 5 to the BPSG film 3, in addition to the shrinking force of the BPSG film 3. It is presumed that since the BPSG film 3 is excessively deformed, stress is applied to the silicon nitride film 5, which causes the crack 9.

For the latest semiconductor integrated circuit devices, a smoothing technique is indispensably adopted for smoothing steps formed on a surface of an interlayer insulating film, to establish high density electrode wiring. A reflowing process of an interlayer insulating film is one of the most typical smoothing techniques. Boron-phosphosilicate glass (BPSG) has been widely used as a reflowing material. In accordance with the prior art of the reflowing process, the BPSG film is deposited on the surface of semiconductor substrate where lower electrode patterns and other elements are formed. Then the substrate is heated at the temperature of about 900° C., so as to cause the surface of the deposited BPSG film to be softened, smoothed, and flattened. Then, contact holes and other openings are formed through the interlayer insulating film, namely, the BPSG film by the conventional photolithographic patterning. Then, the semiconductor substrate is heated again at the temperature of about 900° C. so as to cause the edges of contact holes and openings in the BPSG film to be softened, smoothed, and rounded.

As mentioned above, the prior art reflowing process required two heat treatments of about 900° C. namely after depositing BPSG film and after patterning BPSG film. However, these heat treatments increase the thermal cycles of the semiconductor substrate, which may cause the problems, that for example, the MOSFET's characteristics integrated thereon are varied. Furthermore as illustrated in FIG. 8A, a portion of the BPSG film positioned between contact holes becomes smaller, then the portion of BPSG film therebetween becomes more round like a ball, because of the surface tensions caused by softening thereof by the second heat treatment. Thus, the aluminum wiring electrode can not be suitably formed on such rounded portions and can not contact with the lower electrode or elements through the contact holes of the BPSG film.

SUMMARY OF THE INVENTION

The present invention was developed in order to overcome the above mentioned technical problems.

It is therefore an object of the present invention to provide a new reflowing process which enables the reduction of thermal cycles involved in manufacturing semiconductor integrated circuit devices, and the reduction of the heat treatment temperature thereof.

According to the present invention, depositing a silicon nitride film on the BPSG film having contact holes and openings therein at the temperature range of 700°–800° C. provides an excellent reflowing effect for the edges of contact holes and openings in the BPSG film to deform these edges to become smooth and round.

Therefore, even if the line width of the BPSG film portion between contact holes becomes narrower, the shape of the BPSG film portion does not become round like a ball as shown in FIG. 8A but the edge of the BPSG film becomes smooth and round as shown in FIG. 8B on which aluminum wiring electrodes are formed.

It is another object of the present invention to provide a capacitance element with a novel structure that can prevent cracking in a silicon nitride film which is sandwiched between the upper electrode and the lower electrode working as a thin dielectric film of a capacitance element.

According to the present invention, by substantially dividing a BPSG film around the silicon nitride film into a silicon nitride surrounding portion and a region adjacent to the former portion, cracking in a silicon nitride film is prevented.

This and other objects of the present invention will become apparent from the following drawings and detailed description taken in connection with the drawings.

DETAILED DESCRIPTION OF THE PREFERRED EMBODIMENTS

Preferred embodiments according to the present invention will be explained below in detail with reference to the attached drawings.

Figure 1:
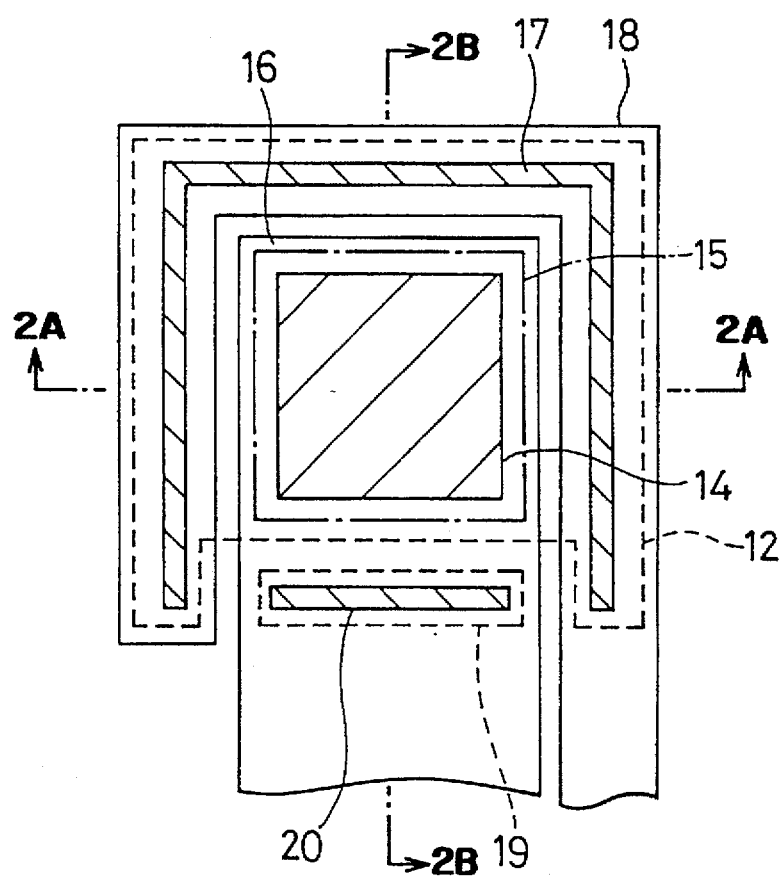
FIG. 1 is a plan view showing a capacitance element built in a semiconductor integrated circuit device according to a first embodiment of the present invention.
Figure 2A:
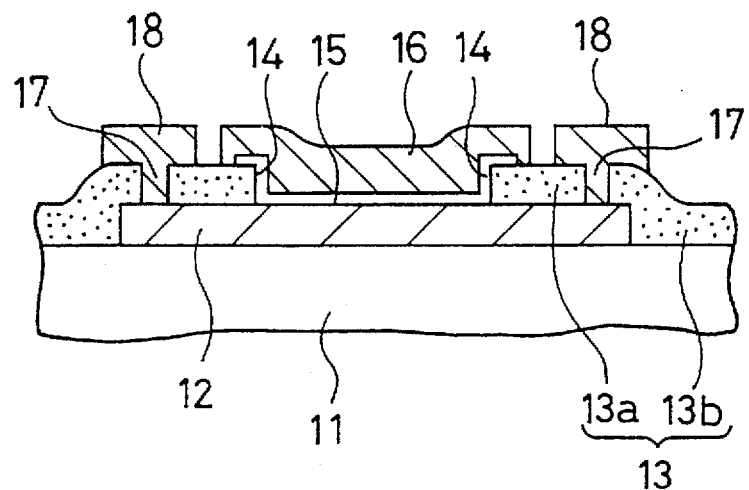
FIG. 2A is a cross-sectional view taken along line 2A—2A in FIG. 1.
Figure 2B:
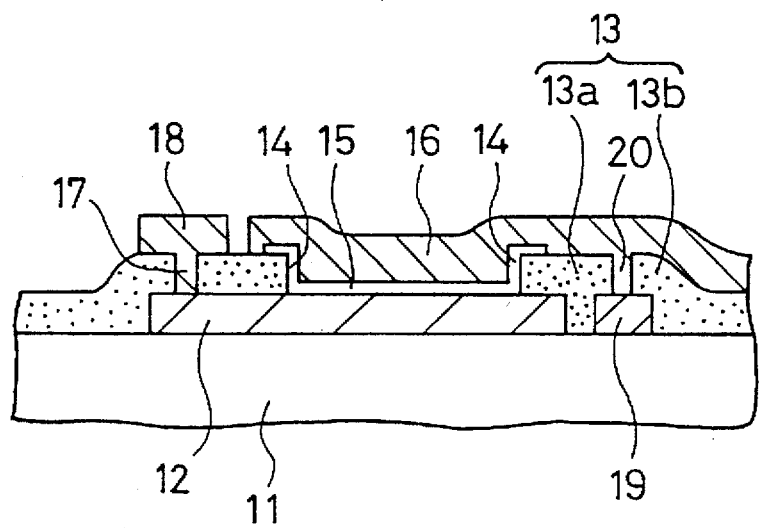
FIG. 2B is a cross-sectional view taken along line 2B—2B in FIG. 1.

As illustrated in FIGS. 1 and 2A–2B, a LOCOS oxide film 11 used for element isolation is formed on a surface of a semiconductor substrate or epitaxial layer (not shown) according to a selective oxidizing process. A lower electrode 12 or one electrode of a capacitance element which is made of a polycrystalline silicon material is formed on the LOCOS oxide film 11. A BPSG film 13 acting as an interlayer insulating film is formed over the LOCOS oxide film 11 and the lower electrode 12. An opening 14 is formed in the BPSG film 13 to expose a surface of the lower electrode 12.

A silicon nitride film 15 acting as a dielectric thin film of a capacitance element is coated over the lower electrode 12 so as to cover the opening 14. The silicon nitride film 15 extends to the surface of the BPSG film 13 around the opening 14.

An upper electrode 16 acting as the other electrode of the capacitance element is formed of a first level aluminum wiring electrode layer so as to cover the silicon nitride film 15. The upper electrode 16 extends on the BPSG film 13 to be connected electrically to other circuit elements. A first contact hole 17 opens in the BPSG film 13 so as to surround the silicon nitride film 15 except the extending upper electrode 16. A take-out electrode 18 derived from the lower electrode 12 is formed of the first level aluminum wiring electrode layer and is contacted with the lower electrode 12 via the first contact hole 17. The take-out electrode 18 extends on the BPSG film 13 to be connected electrically to other circuit elements.

A dummy electrode 19 electrically isolated from the lower electrode 12 is formed on the LOCOS oxide film 11. The dummy electrode 19 is made of the polycrystalline silicon material and is arranged underneath the extending upper electrode 16. A second contact hole 20 is opened in the BPSG film 13 overlying the dummy electrode 19. The upper electrode 16 is in contact with the dummy electrode 19 via the second contact hole 20. As the dummy electrode 19 is isolated from the lower electrode 12, the first and second contact holes 17 and 20 are discontinuously arranged with respect to each other to ensure an electrical isolation between the upper electrode 16 and the lower electrode 12.

Both the first and second contact holes 17 and 20 surround nearly completely the silicon nitride film 15. This structure separates a BPSG film 13 into the first portion 13a surrounding the silicon nitride film 15 and a second portion 13b extending outwards. Hence the first portion 13a of the BPSG film 13 surrounding the silicon nitride film 15 has far less volume than the second portion 13b, because it is located between the opening 14 and the first and second contact holes 17 and 20.

The amount of the deformation of the BPSG film 13 during the deposition of the silicon nitride film 15 depends on the volume of the BPSG film 13. In other words, the smaller the volume, the smaller the deformation, and the larger the volume, the larger the deformation. It is inferred that a change per unit volume of the BPSG film 13 is nearly constant. Therefore, in comparison with a change of the contact hole 21 around which a large amount of the BPSG film 13b exists, the opening 14, around which is only a small volume of the BPSG film 13a deforms very slightly. The small change in shape of the BPSG film 13a results in little stress being applied to the adjacent silicon nitride film 15 coated along the opening 14, thus preventing a crack from occurring in the silicon nitride film 15.

Both the dummy electrode 19 and the second contact hole 20 are arranged so as to substantially dive the BPSG film 13a surrounding the silicon nitride film 15, although both the upper electrode 16 and the take-out electrode 18 are formed of the same wiring electrode layer. Moreover, the take-out electrode 18 can be substantially contacted with the entire portion on which the first contact hole 17 is formed, to reduce the resistance component of the lower electrode 12.

Figure 4A:
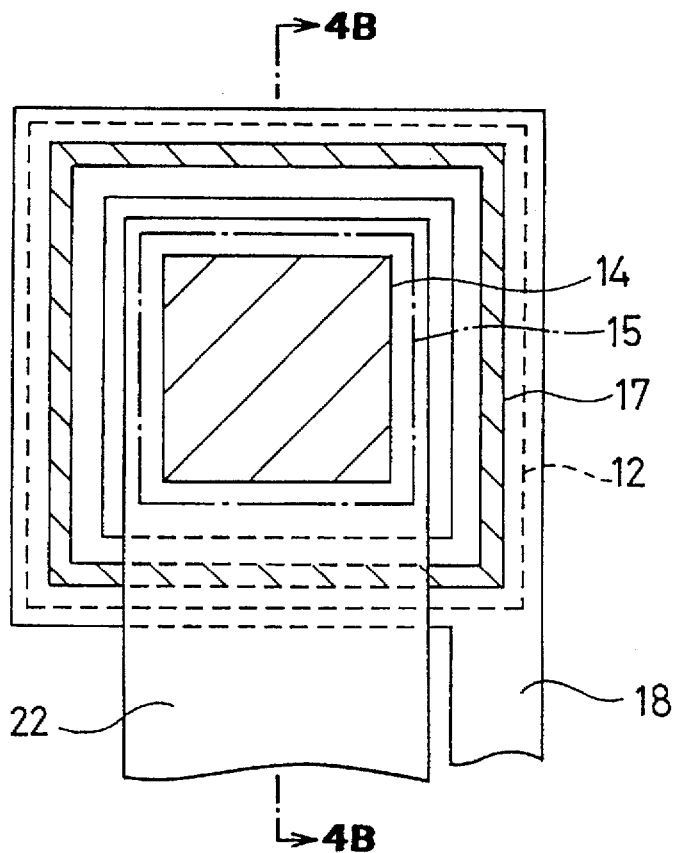
FIG. 4A is a plan view used for explaining a second embodiment of the present invention.
Figure 4B:
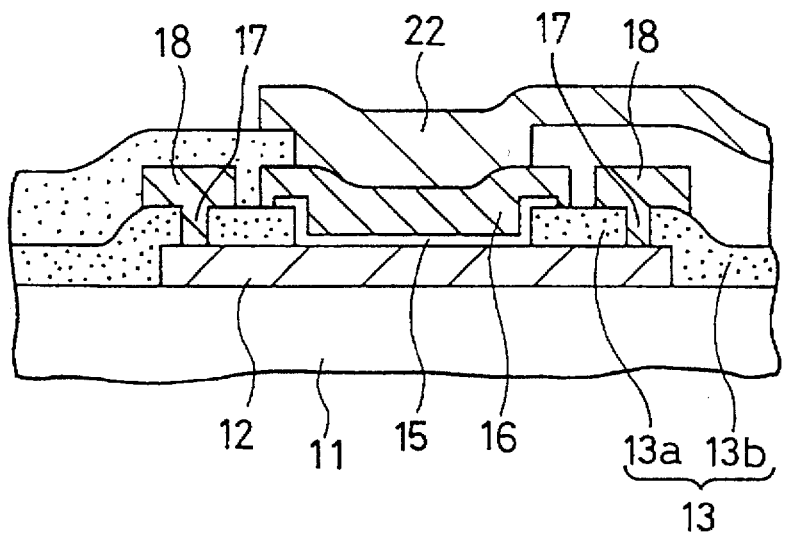
FIG. 4B is a cross-sectional view taken along line 4B—4B in FIG. 4A.

FIGS. 4A and 4B show a second embodiment according to the present invention. FIG. 4A is a plan view of the second embodiment of a capacitance element. FIG. 4B is a cross-sectional view of the capacitance element taken along line C—C in FIG. 4A. The same reference numerals are attached to the elements which correspond to the same elements in the first embodiment shown in FIG. 1, FIG. 2A and FIG. 2B. In the first embodiment, the take-out electrode 18 of the lower electrode 12 and the upper electrode 16 are both formed of an aluminum wiring electrode of the same layer, and the first and second contact holes 17 and 20 are separated from each other. Hence, the portion at which the BPSG film 13 cannot be separated may occur inevitably. According to the present embodiment, the upper electrode 16 is taken via the take-out electrode 22 of the second level aluminum wiring layer as shown in FIG. 4A and FIG. 4B. Since an interlayer isolation can be formed between the take-out electrode 22 for the upper electrode 16 and the take-out electrode 18 for the lower electrode 12, the first contact hole 17 can be continuously formed around the entire periphery of the silicon nitride film 15. Therefore according to the second embodiment, the BPSG film 13 can be separated so as to surround the entire circumference around the silicon nitride film 15 by using a multilevel metalization technique.

Figure 5A:
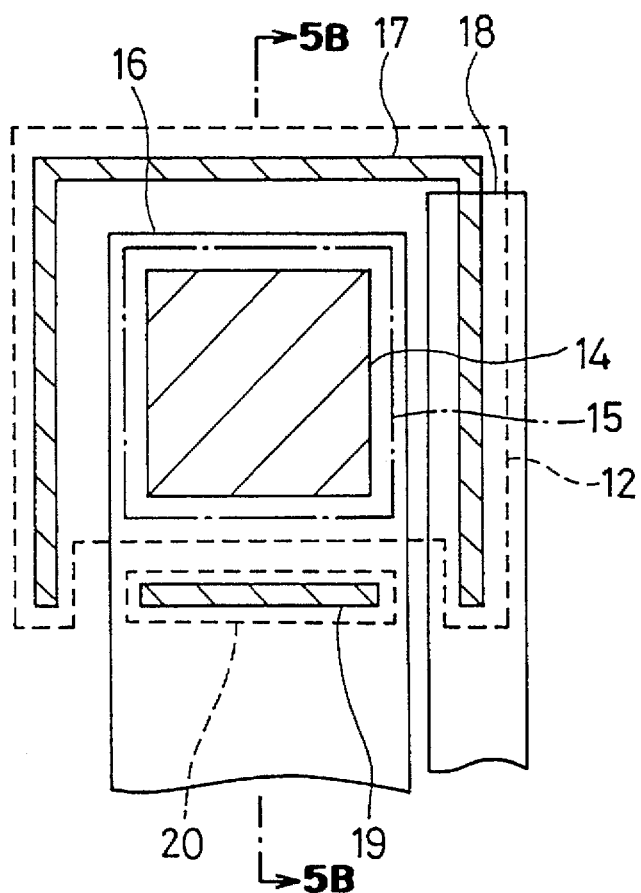
FIG. 5A is a plan view used for explaining a third embodiment of the present invention.
Figure 5B:
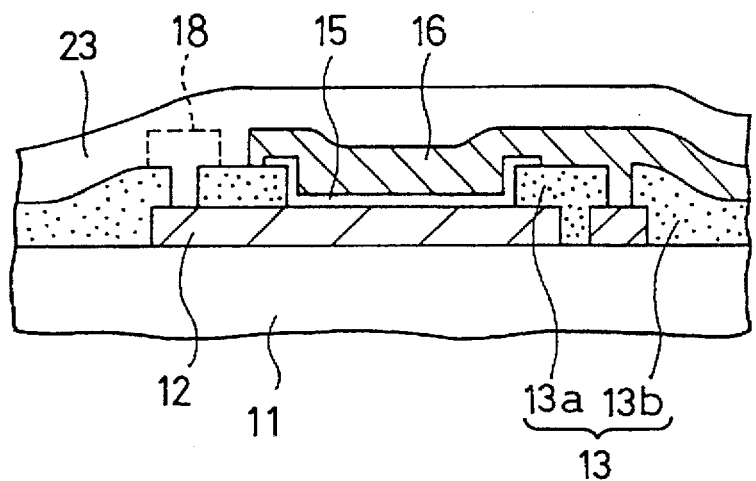
FIG. 5B is a cross-sectional view taken along line 5B—5B in FIG. 5A.

FIGS. 5A and 5B show the third embodiment of the present invention. FIG. 5A is a plan view of a capacitance element according to the third embodiment. FIG. 5B is a cross-sectional view of a capacitance element taken along line 5B—5B in FIG. 5A. Referring to the first and second embodiments, the lower electrode 12 and the take-out electrode 18 are nearly in contact with the entire periphery of the silicon nitride film 15. The contact along the entire periphery can reduce the resistance component of the lower electrode 12. According to the present embodiment, in the case that the lower electrode 12 has a very low resistance component, then it is not necessary for the take-out electrode 18 to contact all peripheral portions of the lower electrode 12. As shown in FIG. 5B, the remaining portion of the first contact hole 17, at which the take-out electrode does not exist, is buried under the BPSG film 23 which is formed after formation of the upper electrode 16. Therefore according to the third embodiment, since the take-out electrode 18 is partially contacted to the lower electrode 12, the area occupied by aluminum wiring electrode can be reduced.

Figure 6A:
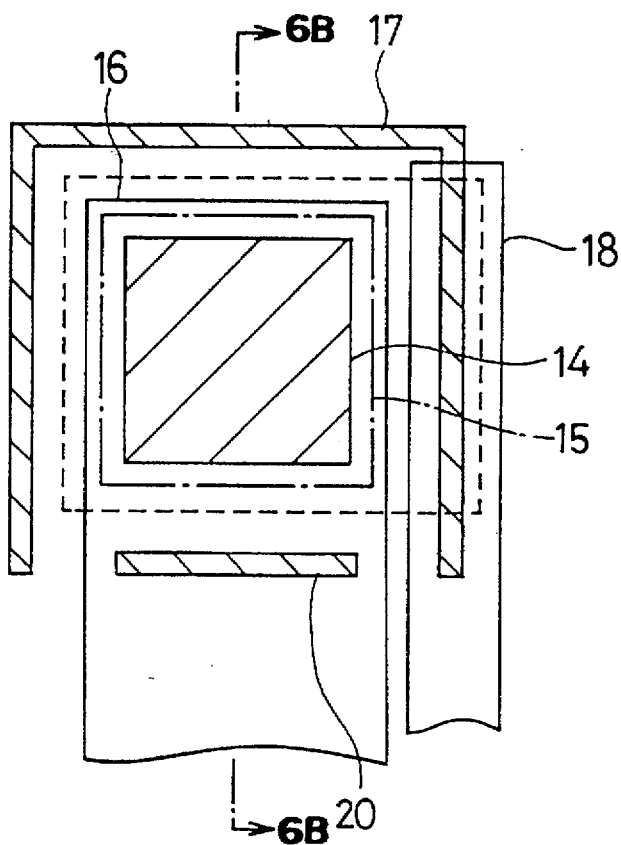
FIG. 6A is a plan view used for explaining a fourth embodiment of the present invention.
Figure 6B:
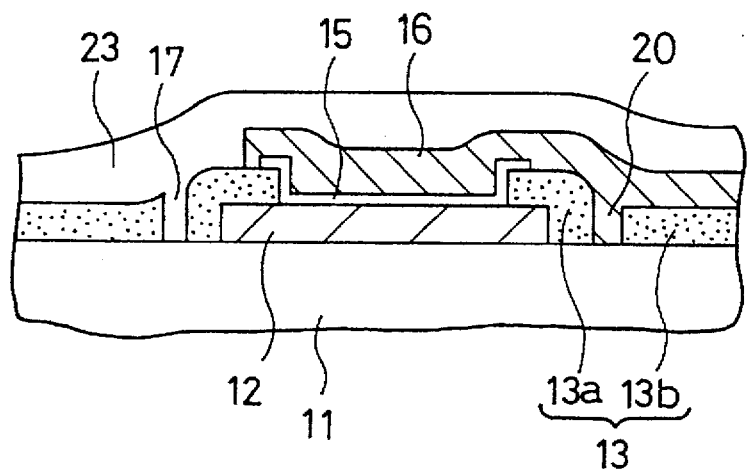
FIG. 6B is a cross-sectional view taken along line 6B—6B in FIG. 6A.
Figure 7A:
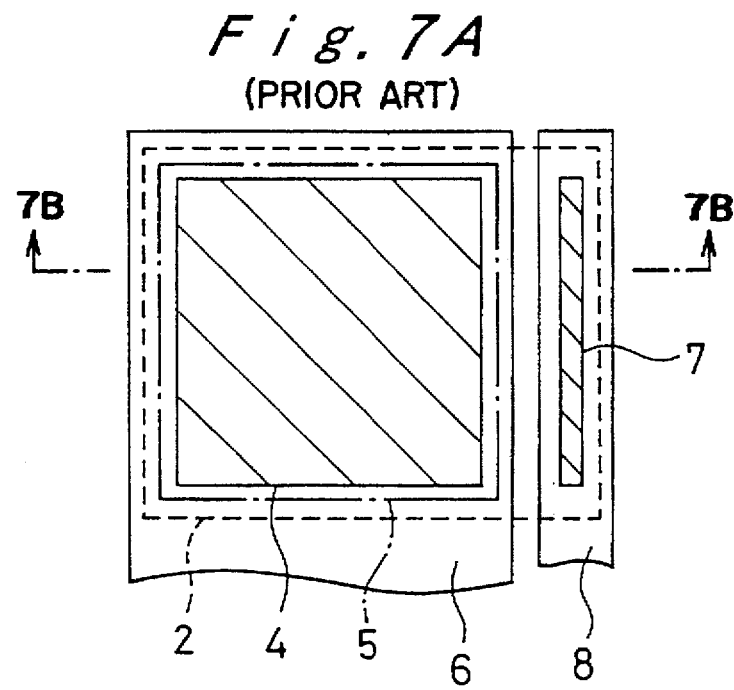
FIG. 7A is a plan view of a conventional capacitor element in a semiconductor integrated circuit device.
Figure 7B:
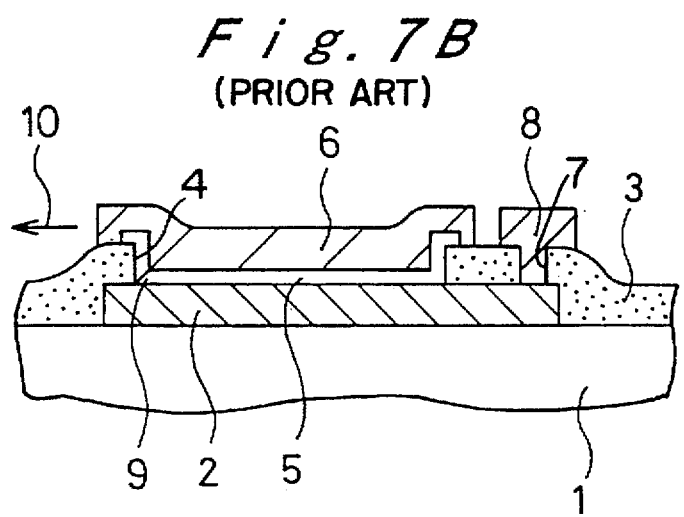
FIG. 7B is a cross-sectional view taken along line 7B—7B in FIG. 7A.

FIGS. 6A and 6B show the fourth embodiment according to the present invention. FIG. 6A is a plan view of a capacitance element of the present embodiment. FIG. 6B is a cross-sectional view of a capacitance element taken along line 6B—6B in FIG. 6A. In the first to third embodiments, both the lower electrode 12 and the dummy electrode 19 are arranged underneath the first and second contact holes 17 and 20, so as to terminate the etching process of the BPSG film 13 at the polycrystalline silicon layer. In addition to serving to cause the etching termination, the dummy electrode 19 under the second contact hole 20 serves to keep the upper electrode 16 flat to prevent disconnection of the electrode 16. If the manufacturing process is allowable concerning the above mentioned requirements, the lower electrode 12 and dummy electrode 19 can be removed from under the first and second contact holes 17 and 20 as shown in FIG. 6B, except for the portion where the take-out electrode 18 is contacted. A smaller lower electrode 12 can reduce an area occupied by the capacitance element by the amount reduced. Therefore according to the fourth embodiment, since the areas of both the lower electrode 12 and the take-out electrode 18 can be reduced, the area occupied by a capacitance element can be further reduced.

As described above, according to the present inventions, arranging the first and second contact holes 17 and 20 in the BPSG film 13 around the silicon nitride film 15 causes a separation of the BPSG film 13a and 13b. Then the volume of the BPSG film 13a which contacts the silicon nitride film 15 becomes small, thus decreasing the deformation of the BPSG film 13 which occurs at a deposition time of the silicon nitride film 15. Hence, since the stress which occurs in the silicon nitride film 15 deposited along the shape of the opening 14 of the BPSG film 13a becomes small, the occurrence of a crack in the silicon nitride film 15 can be prevented.

Figure 3A:
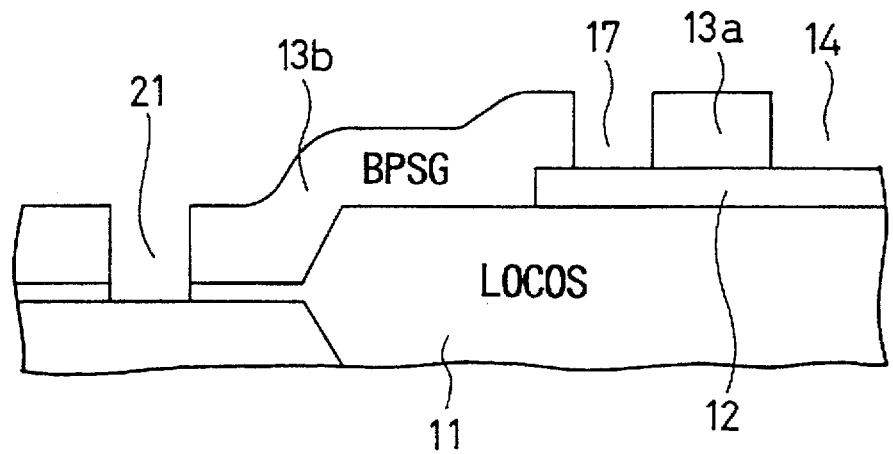
FIG. 3A is a cross-sectional view showing a capacitance element after making contact holes in a BPSG film.
Figure 3B:
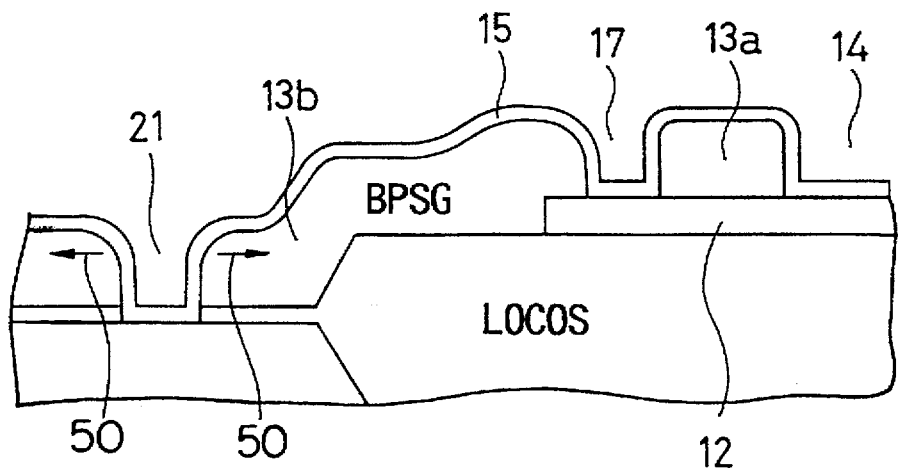
FIG. 3B is a cross-sectional view showing a capacitance element after depositing a silicon nitride film on a BPSG film.
Figure 3C:
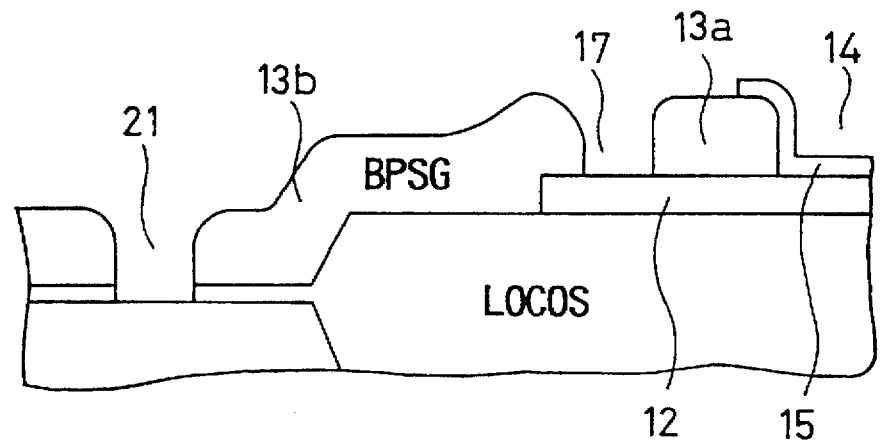
FIG. 3C is a cross-sectional view showing a capacitance element after etching a part of the silicon nitride film.

FIGS. 3A to 3C are cross-sectional views each showing a deformation process of the BPSG film 13. FIG. 3A shows a step before the silicon nitride film 15 is deposited. FIG. 3B shows a step after the silicon nitride film 15 has been deposited. FIG. 3C shows a step after the silicon nitride film has been patterned.

Before these steps, the LOCOS oxide film 11 has been formed on the semiconductor substrate or the epitaxial layer thereon. Through processes of depositing a polysilicon layer, coating a photoresist layer thereon, patterning the polysilicon layer by the photolithography using a photomask, and removing the patterned photoresist layer, the lower electrode 12 has been formed on the LOCOS oxide 11.

The BPSG film 13 has been formed by a normal pressure CVD method and then is immediately subjected to a thermal process of about 900° C. to reflow. This reflowing process of this stage smoothes the surface of the steps of the underlying layer. By the following patterning process, the opening 14 for a capacitance element, and the contact holes 17, 20, and so on are opened in the BPSG film 13. The contact holes may be formed through a dry anisotropic etching, or a two-step etching including an anisotropic etching and an isotropic etching. At this step, the edges of the openings and contact holes are not round shaped but are rectangular shaped as illustrated in FIG. 3A. Sequentially, the edges of the openings and the contact holes 14, 17 and 21 in the BPSG film 13, as shown in FIG. 3B, are smoothly deformed by depositing the silicon nitride film 15 by a LPCVD method. Therefore, the prior art reflowing process for smoothing edges of openings and contact holes after patterning the BPSG film by heat treatment of about 900° C. is not required.

Since the reflow temperature of the BPSG film 13 according to the prior art is about 900° C., the deposition process temperature of the silicon nitride film 15 ranges from 700° to 800° C. for several minutes. Therefore, it is difficult to reflow the BPSG film 13 due only to the temperature of 700°–800° C. itself. It is considered that the silicon nitride film 15 deposited at 700° to 800° C., and a difference of thermal expansion coefficient between the silicon nitride film 15 and the BPSG film 13 can cause an excellent reflowing effect.

Therefore it is considered that stresses as shown in FIG.3B as numerical reference 50 are generated during the deposition of the silicon nitride film 15. In accordance with the above-mentioned stresses, the edges of the BPSG film are deformed to be smooth and round at the temperature range of chemical vapor deposition, namely 700°–800° C., even though the BPSG film 13b is not heated up to the normal reflowing temperature of 900° C. After this, patterning of the silicon nitride film is carried out, and then patterned silicon nitride film is removed from the surface of the BPSG film 13b and contact holes, except for the capacitance area, and the upper electrode is formed on the deformed contact holes and the surface of the BPSG film.

Moreover, the above-mentioned nitride film reflowing process, by which the shape of the contact holes in the BPSG film 13 is deformed during deposition of the silicon nitride film 15, can provide a good step coverage when an electrode of metal such as aluminum is formed at contact holes in the BPSG film 13, thus effectively preventing, a disconnection of a metal electrode at the edges of the contact holes. This effect will be explained below with reference to FIGS. 8A and 8B.

Figure 8A:
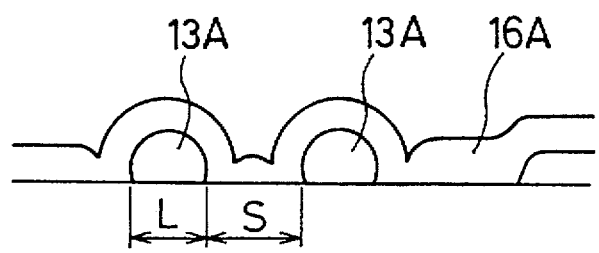
FIG. 8A is a cross-sectional view showing the shape of the contact formed by conventional thermal reflowing.
Figure 8B:
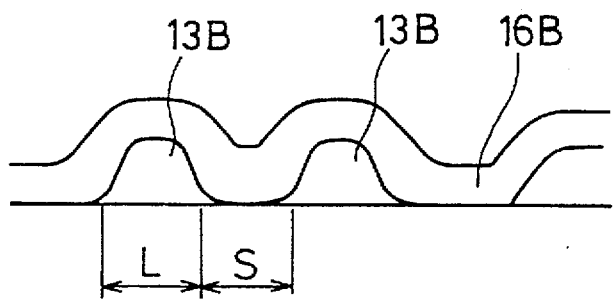
FIG. 8B is a cross-sectional view showing the shape of the contact holes formed by nitride film covering (reflowing) according to an embodiment of the present invention.

FIG. 8A shows a variation in shape of contact holes in the BPSG film by a conventional thermal reflowing process. FIG. 8B shows a variation in shape of contact holes in the BPSG film during the nitride film reflowing process according to the embodiment of the present invention. As shown in FIG. 8A, in the case of the BPSG film portion (L) and the opening (S) each having a narrower pattern (for example, L/S=1.6 mm/1.6 mm), the conventional thermal reflowing process causes swelling of the BPSG film 13A like a ball (shown in FIG. 8A), resulting in extreme degradation of the step coverage of the metal electrode 16A. On the other hand, the nitride film reflowing process, as shown in FIG. 8B, can smooth the edges of the BPSG film portion 13B even if each of the BPSG film portion (L) and the opening (S) has a narrow pattern width (for example, L/S=1.6 mm/1.6 mm). As a result, the step coverage of the metal electrode 16B can be improved.

Furthermore the nitride reflowing process of contact holes 17, 21, etc. is carried out at a relatively low temperature 700°–800° C., and thus it can reduce the thermal cycles of the semiconductor integrated circuit elements. Therefore the nitride reflowing process improved by reducing the occurrence of variance of characteristics of individual elements such as MOSFETS.

Also, the silicon nitride film 15 as used for the reflowing process of smoothing the edges of contact holes of BPSG film, is of course available to serve as a thin dielectric film of capacitance elements which remained from patterning of the silicon nitride film after the reflowing process, namely deposition itself. It can simplify the process of manufacturing integrated circuit devices having thin dielectric film capacitors by omitting the prior art reflowing process.

This purpose is easily attained by causing some portions of the silicon nitride film to remain by photolithographic patterning for thin dielectric films of capacitors, when the silicon nitride film is removed after the reflowing process, namely deposition thereof. Also, capacitor elements as shown in FIGS. 1, 2A, 2B, 4A, 4B, 5A, 5B, 6A, 6B and utilize thin dielectric films of silicon nitride film 15 which have been utilized for reflowing processes of underneath BPSG films 13.

The present invention should not be restricted to a capacitance element, which adopts a BPSG film 13 as an interlayer insulating film, but, rather, other kinds of insulating film which can be deformed due to the silicon nitride film 15 deposited thereon can be applicable.

While a semiconductor integrated circuit device which has a capacitor element, has been described by way of example, the principles of the present invention are also applicable to a wide range of semiconductor devices.

Although a certain preferred embodiment of the present invention has been shown and described in detail, it should be understood that various changes and modifications may be made therein without departing from the scope of the appended claims.

What is claimed is:

1. A method of manufacturing a semiconductor integrated circuit device, said method comprising:

depositing an insulating film on a semiconductor substrate;

opening contact holes in said insulating film;

depositing a silicon nitride film on said insulating film in said contact holes by LPCVD at a temperature between 700° C. and 800° C. so as to deform edges of said contact holes in said insulating film to be rounded and smooth; and removing said silicon nitride film on said insulating film in said contact holes of said insulating film.

2. A method of manufacturing a semiconductor integrated circuit device according to claim 1, wherein said insulating film comprises a boron-phosphosilicate glass film.

3. A method of manufacturing a semiconductor integrated circuit device, said method comprising:

forming lower electrodes;

depositing an insulating film on said lower electrodes;

forming openings in said insulating film so as to expose surfaces of said lower electrodes, and forming contact holes in said insulating film;

depositing a silicon nitride film on said insulating film in said openings and contact holes in said insulating film by LPCVD at a temperature between 700° C. and 800° C. so as to deform said edges of said openings and contact holes in said insulating film to be rounded and smooth;

patterning said silicon nitride film so as to remove said silicon nitride film from said contact holes and leave remaining said silicon nitride film on said lower electrodes in said openings; and forming upper electrodes on said silicon nitride film, said silicon nitride film being sandwiched by said lower electrodes and upper electrodes, respectively, for forming a capacitance element therebetween.

4. A method of manufacturing a semiconductor integrated circuit device according to claim 3, wherein said insulating film comprises a boron-phosphosilicate glass film.

* * * * *